United States Patent [19]
Lee

[11] Patent Number: 5,923,972
[45] Date of Patent: Jul. 13, 1999

[54] DRAM CELL CAPACITOR FABRICATION METHOD

[75] Inventor: Sang-Don Lee, Choongcheongbook-Do, Rep. of Korea

[73] Assignee: LG Semicon Co., Ltd., Cheongju, Rep. of Korea

[21] Appl. No.: 08/703,329

[22] Filed: Aug. 23, 1996

[30] Foreign Application Priority Data

Dec. 29, 1995 [KR] Rep. of Korea ............ 95-67320

[51] Int. Cl.⁶ .................................. H01L 21/8242
[52] U.S. Cl. .............................. 438/253; 438/254
[58] Field of Search .................. 438/238, 239, 438/253–256, 381, 396–399

[56] References Cited

U.S. PATENT DOCUMENTS

| | | | |
|---|---|---|---|
| 5,140,389 | 8/1992 | Kimura et al. | 357/23.6 |
| 5,488,011 | 1/1996 | Figura et al. | 437/60 |
| 5,753,550 | 5/1998 | Murata et al. | 438/253 |

*Primary Examiner*—Joni Chang
*Attorney, Agent, or Firm*—Fleshner & Kim

[57] ABSTRACT

A method for making a cell capacitor of a semiconductor device such as a dynamic random access memory includes steps for increasing the height of a capacitor electrode. With increased height, the capacitance of the fabricated capacitor is increased while allowing high integration.

16 Claims, 4 Drawing Sheets

DRAM CELL CAPACITOR FABRICATION METHOD

TECHNICAL FIELD

The present invention relates to a capacitor fabrication method, and particularly, to a capacitor fabrication method to achieve high capacitance and integration capable of more effectively increasing the capacitance thereof compared to U-shaped DRAM cell capacitor.

BACKGROUND ART

In the field of semiconductor memory devices, it is necessary to minimize the surface of the memory cell array to achieve high integration. A representative example requiring the above-mentioned conditions is a dynamic random access memory (DRAM) comprising one transistor and one capacitor. Since the capacitor occupies the majority of the limited chip surface, it is necessary to minimize the occupying surface of the capacitor. At the same time, the capacitance must be increased to achieve an easier information detection.

FIGS. 1A through 1D illustrate a conventional U-shaped DRAM cell capacitor fabrication process. The cylinder-shaped construction is directed to maximizing the effective surface of the capacitor without expanding the memory cell region. As shown in FIG. 1A, a field oxide 1 is grown at a device isolation region of the p-type silicon substrate S. A gate insulation film 2 and a gate 3 are formed, and a source/drain region, which is a diffusion region of a cell capacitor, within a substrate S at the left/right side of the gate 3 to form a switching transistor.

A first CVD oxide film 5 is formed at the surface of the substrate S including the gate 3. A predetermined portion of the first CVD oxide film 5 is etched using a bit contact mask so as to expose a predetermined portion of the substrate S between the gates 3. A bit line 6, which is a conductive film, is formed so as to connect each drain region of the switching transistor.

A second CVD oxide film 5' is formed on the first CVD oxide film 5 including the bit line 6, and a CVD nitride film 8, serving as an etch stopper film, is formed on the second CVD oxide film 5'. The etch stopper film 8 and the second and first CVD oxide film 5' and 5 are etched so as to expose a predetermined portion of the surface of the substrate S, using a cell contact mask, to form a contact hole. Hereinafter, the first and second CVD oxide films 5 and 5' are collectively referred to with a new reference numeral 7.

Thereafter, as shown in FIG. 1B, a first conductive film (for example, a poly-silicon) 10 is deposited on the etch stopper film 8 including the contact hole. A CVD oxide film, which serves as a second insulation film 11, is formed on the first conductive film 10. Spaced-apart photoresist patterns 12, which are to be used as a node mask, are formed thereon, and the second insulation film 11 and the first conductive film 10 are etched using the photoresist pattern 12 as a mask. Thus, a horizontal node electrode is formed.

Further, as shown in FIG. 1C, the photoresist pattern 12 is removed, a second conductive film (for example, a poly-silicon) 13 is deposited on the etch stopper film 8, including the side surface of the horizontal node electrode and the second insulation film 11, and is dry-etched. Thus, a vertical node electrode is formed. At this time, the surface of the etch stopper there is a limitation in increasing the surface of the capacitor.

DISCLOSURE OF THE INVENTION

The present invention can be achieved in part by a method of making a semiconductor device, comprising the steps of: forming a first insulation layer on a substrate; forming a stopper film on the first insulation layer; forming a second insulation layer; forming a contact hole through the first and second insulation films and the stopper film; forming a first conductive layer in the contact hole and the second insulation layer; forming a third insulation layer; removing a predetermined portion of the second and third insulation layers and the first conductive layer; forming a second conductive layer on sidewalls of the second and third insulation layers, the second conductive layer being in coupled to the first conductive layer; removing the second insulation film to expose the first conductive layer; forming a dielectric film on the first conductive layer; and forming a third conductive layer on the dielectric film.

The present invention can be also achieved in part by a method of making a capacitor, comprising the steps of: forming a first insulation film on a substrate; forming spaced-apart etch stopper films on the first insulation film; forming a second insulation film on the first insulation film and the etch stopper films; etching the second insulation film and the first insulation film to form a contact hole so as to expose a predetermined portion of the substrate; forming a horizontal node electrode on a predetermined portion of the second insulation film including the contact hole; forming a third insulation film on the horizontal node electrode; etching the second insulation film using the third insulation film and the horizontal node electrode; forming a vertical node electrode at a side surface of the third insulation film and the horizontal node electrode, and the second insulation film; removing the third insulation film; and forming a dielectric film on the etch stopper film including the horizontal and vertical node electrode and forming a plate electrode thereon.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1A:
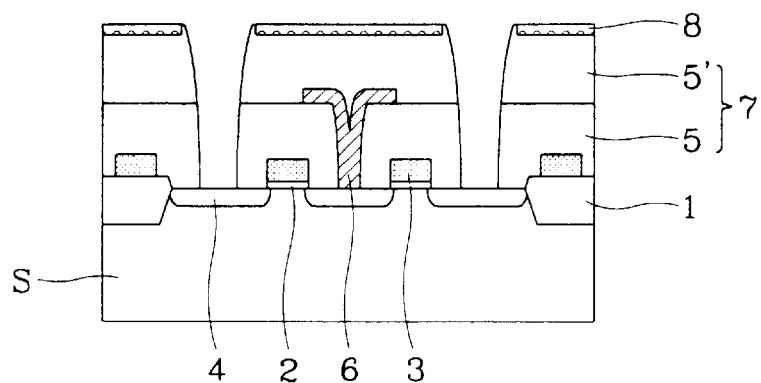
FIGS. 1A through 1D are cross-sectional views of a conventional U-shaped DRAM cell capacitor illustrating a fabrication process thereof.
Figure 1B:
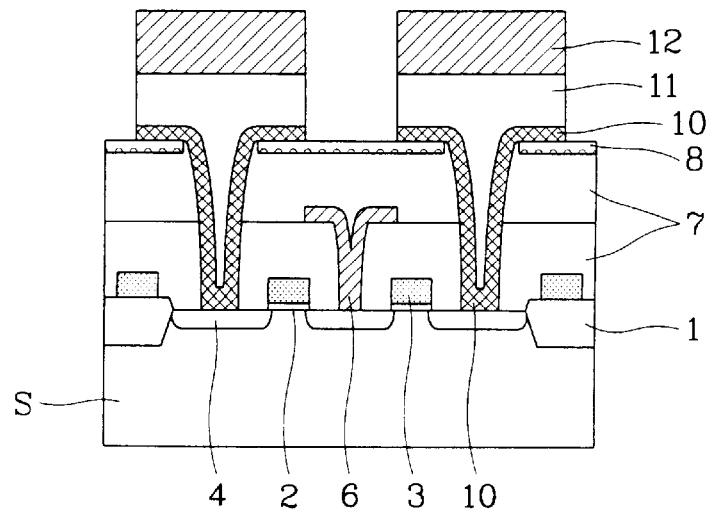
Figure 1C:
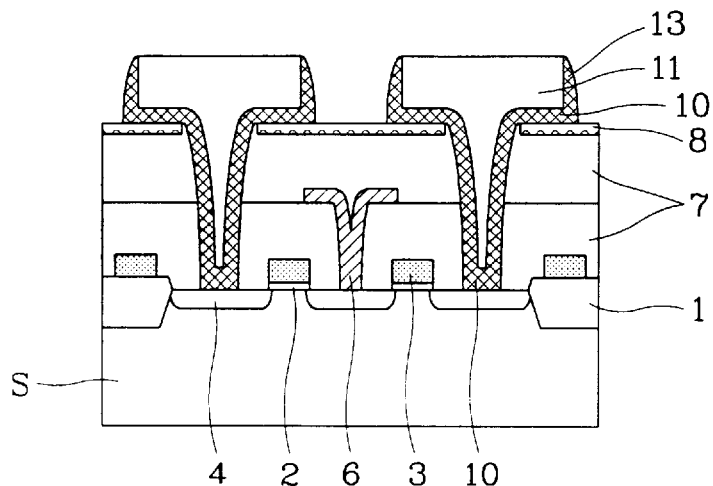
Figure 1D:
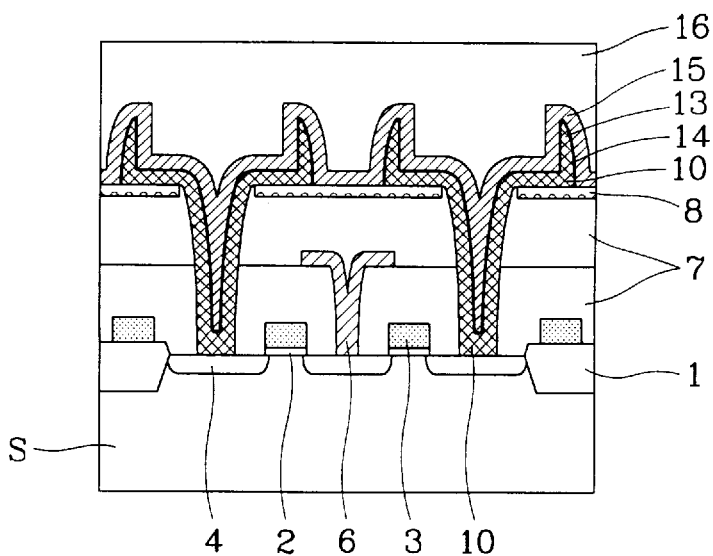
Figure 2A:
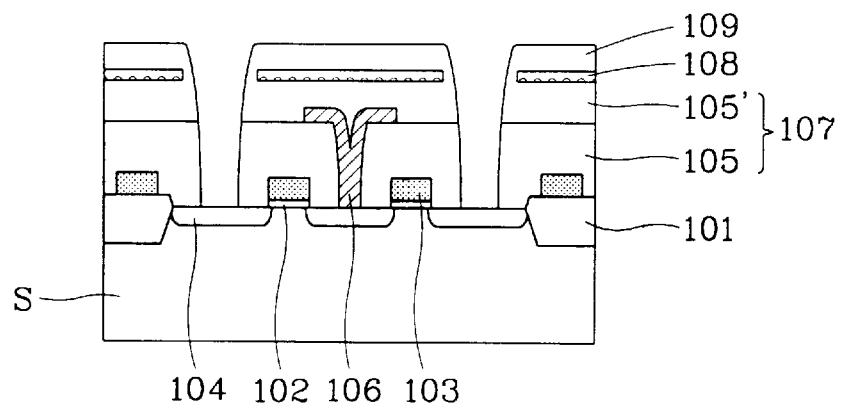
FIGS. 2A through 2D are cross-sectional views of an H-shaped DRAM cell capacitor illustrating a fabrication process thereof according to the present invention.

FIGS. 2A–2D illustrate the fabrication process to increase the capacitance of an H-shaped cell capacitor of a semiconductor device, such as a DRAM. As shown in FIG. 2A, a field oxide 101 is grown in a device isolation region of a p-type silicon substrate S. A gate insulation film 102 and a gate 103 are formed, and a source/drain region, which is a diffusion region 104 of a cell capacitor, is formed within the substrate S at the left/right side of the gate 103. Hence, a switching transistor is fabricated.

Thereafter, a first CVD oxide film 105, serving as an insulation film, is formed at a surface of the substrate S including the gate 103. A predetermined portion of the first CVD oxide film 105 is etched so as to expose a predetermined portion of the substrate S between the gates 103 using a bit contact mask. A bit line 106 of a conductive film is formed for a connection with each drain of the switching transistor.

A second CVD oxide film 105', serving as an insulation film, is formed on the first CVD oxide film 105, including the bit line 106. Spaced-part CVD nitride films having a thickness of about 100 Å to 100 Å are formed on the second CVD oxide film 105' as an etch stopper film 108. Hereinafter, the first and second CVD oxide films 105 and 105' are collectively referred to as a first insulation film 107.

A CVD oxide film, having a thickness of about 500 Å to 1000 Å, which is the second insulation film 109, is formed on the first insulation film 107 including the etch stopper film 108. The second insulation film 109 and the first insulation film 107 are etched so as to expose a predetermined portion of the surface of the substrates using a cell contact mask, so that a contact hole is formed.

The etch stopper film 108 has an etching selectively with respect to the first insulating film 107. The second insulation film 109 has an etching selectively with respect to the etching selectively of etch stopper film 108. Further, the first insulation film 107 may be the same as the second insulation film 109.

Figure 2B:
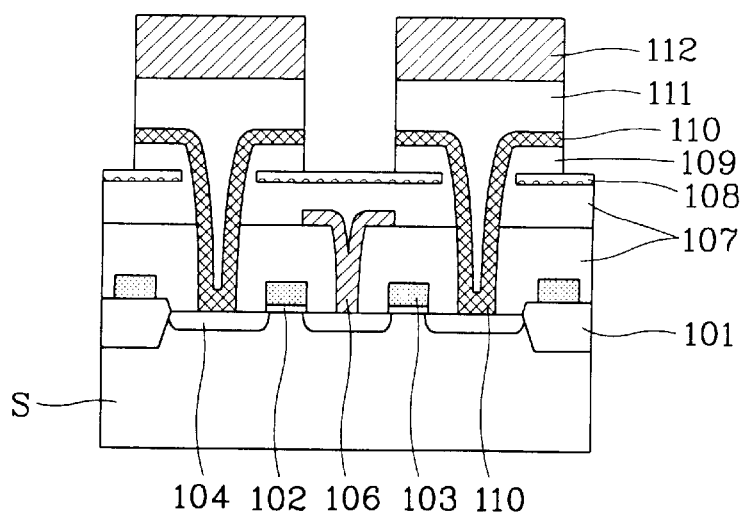

As shown in FIG. 2B, a first conductive film (for example, a poly-silicon) 110 having a thickness of 500 Å through 3000 Å is deposited on the second insulation film 109 including the contact hole. A CVD oxide film, which is the third insulation film 111, is deposited thereon, and spaced-apart photoresist patterns 112 are formed on the third insulation film 111. The third insulation film 111 and the first conductive film 110 are etched by using a node mask of the photoresist pattern 112. Thus, a horizontal node electrode consisting of a first conductive film is formed. The second and third insulation films 109, 111 and the horizontal node electrode are dry-etched until the surface of the etch stopper film 108 is exposed using the photoresist pattern 112 as a mask. Thereafter the photoresist pattern 112 is removed.

Figure 2C:
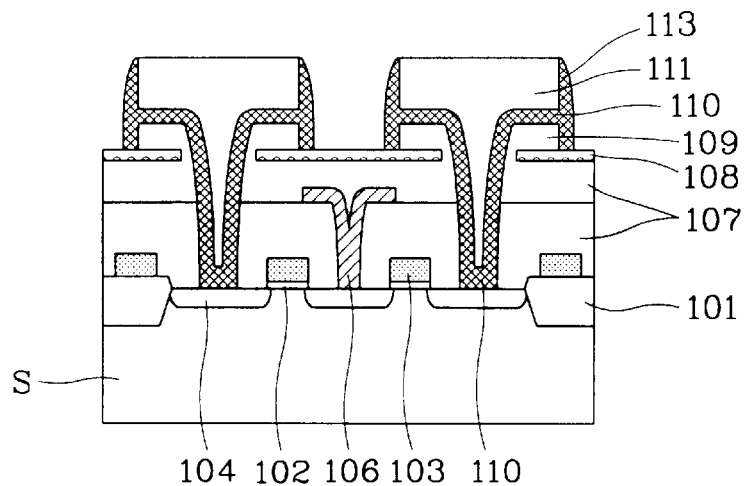

As shown in FIG. 2C, a second conductive film (for example, a poly-silicon) 113 having a thickness of 500 Å through 3000 Å is deposited on the etch stopper film 108 including the second insulation film 109, the horizontal node electrode, and the third insulation film 111. The deposited film is dry-etched. As a result a vertical node electrode consisting of a second conductive film 113 is formed at a side surface of the second insulation film 109, the horizontal node electrode, and the third insulation film 111.

Figure 2D:
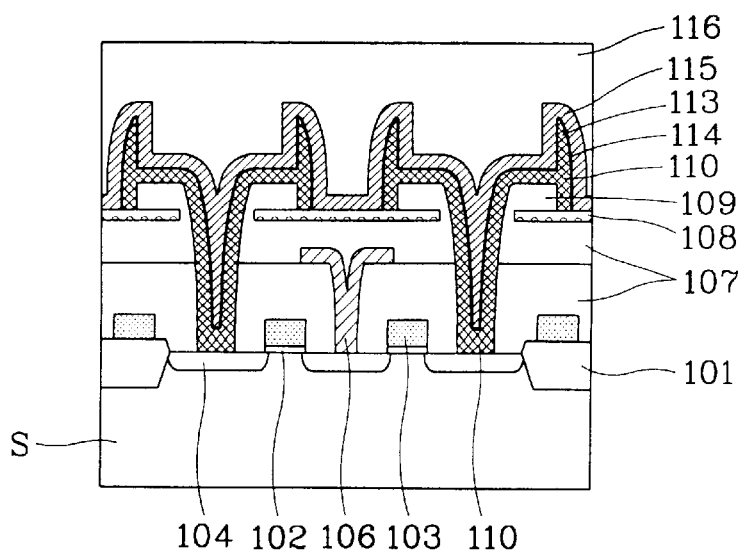

As shown in FIG. 2D, the third insulation film 111 on the horizontal node electrode is removed in a wet etching method, and a thin film, such as a nitride film, $Ta_2O_5$, $BaSrTiO_3$ and the like, is deposited on the surfaces of the horizontal node electrode, the vertical node electrode, and the etch stopper film 108 as a dielectric film 114 having a high dielectric constant. A plate electrode is formed by depositing the third conductive film (for example, a poly-silicon) 115 on the dielectric film 114, and the fourth insulation film 116 is deposited thereon to complete the fabrication of the H-shaped capacitor.

The capacitance $C_2$ of the cell capacitor can be computed by the following expression:

$$C_2 = (\epsilon_2/d_2)^* A_2$$

where $d_2$ denotes the thickness of a cell capacitor dielectric film 114 having a high dielectric constant $\epsilon_2$ and deposited between the horizontal and vertical node electrodes and the plate electrode, $A_2$ denotes the surface area where the horizontal and vertical node electrodes and the plate electrode contact, and $\epsilon_2$ denotes a dielectric constant of a cell capacitor dielectric film.

The higher the height of the vertical node electrode, the deeper the depth of the horizontal node electrode. As a result, the surface area $A_2$ can be increased. When the occupying surface of the capacitor is the same as the U-shaped cell capacitor, it is possible to adjust the surface of the cell capacitor by adjusting the thickness of the second insulation film and to increase the capacitance of the cell capacitor. Second, it is possible to fabricate a DRAM cell having a large capacitance, so that a DRAM having a large charge retention time and a refresh time can be fabricated.

Although the preferred embodiments of the present invention have been disclosed for illustrative purposes, those skilled in the art will appreciate that various modification, additions and substitutions are possible, without departing from the scope and spirit of the invention as described in the accompanying claims.

The foregoing embodiment is merely exemplary and not to be construed as limiting the present invention. The present scheme can be readily applied to other types of semiconductor devices requiring increased capacitance with high integration. The description of the present invention is intended to be illustrative, and not limiting the scope of the claims. Many alternatives, modifications and variations will be apparent to those skilled in the art.

I claim:

1. A method of making a capacitor, comprising the steps of:

forming a first insulation film on a substrate;

forming spaced-apart etch stopper films on said first insulation film;

forming a second insulation film on the first insulation film and said etch stopper films;

etching the second insulation film and the first insulation film to form a contact hole so as to expose a portion of the substrate;

forming a horizontal node electrode on a portion of the second insulation film including the contact hole;

forming a third insulation film on said horizontal node electrode;

etching the second insulation film using said third insulation film and the horizontal node electrode;

forming a vertical node electrode at a side surface of the third insulation film and the horizontal node electrode, and the second insulation film;

removing the third insulation film; and forming a dielectric film on the etch stopper film including the horizontal and vertical node electrode and forming a plate electrode thereon.

2. The method of claim 1, wherein said etch stopper film is formed by a nitride film.

3. The method of claim 1, wherein said second insulation film has a thickness of about 500 Å through 1000 Å.

4. The method of claim 1, wherein said second insulation film is an oxide film an oxide film.

5. The method of claim 1, wherein said horizontal node electrode, vertical node electrode, and plate electrode are made of polysilicon.

6. A method of making a semiconductor device, comprising the steps of:

forming a first insulation layer on a substrate;

forming a stopper film on said first insulation layer;

forming a second insulation layer;

forming a contact hole through said first and second insulation films and said stopper film;

forming a first conductive layer in said contact hole and said second insulation layer;

forming a third insulation layer;

removing a portion of said second and third insulation layers and said first conductive layer;

forming a second conductive layer on sidewalls of said second and third insulation layers, said second conductive layer being in coupled to said first conductive layer;

removing said second insulation film to expose said first conductive layer;

forming a dielectric film on said first conductive layer; and forming a third conductive layer on said dielectric film.

7. The method of claim 6, wherein said first insulation layer is a CVD oxide film.

8. The method of claim 6, wherein said stopper film is a CVD nitride film of about 100 to 1000 angstroms.

9. The method of claim 6, wherein said second insulation layer is a CVD oxide film of about 500 to 1000 angstroms.

10. The method of claim 6, wherein said step of forming said contact hole comprises etching said first and second insulation films and said stopper film.

11. The method of claim 6, wherein said first and second conductive layers are polysilicon of about 500 to 3000 angstroms.

12. The method of claim 6, wherein said third insulation layer is a CVD oxide film.

13. The method of claim 6, wherein said step of removing the portion comprises:

forming a photoresist pattern; and etching said second and third insulation layers and said first conductive layer.

14. The method of claim 6, wherein said step of removing said second insulation film to expose said first conductive layer comprises wet etching said second insulation film.

15. The method of claim 6, wherein said dielectric film is made from one of $Ta_2O_5$, $BaSrTiO_3$ and the like.

16. The method of claim 6, wherein said third conductive layer is a polysilicon.

\* \* \* \* \*